United States Patent [19]
Imai et al.

[11] Patent Number: 4,890,307
[45] Date of Patent: Dec. 26, 1989

[54] INPUT CIRCUIT OF CHARGE TRANSFER DEVICE

[75] Inventors: Shin-ichi Imai; Naoki Hosoya, both of Yokohama, Japan

[73] Assignee: Kabushiki Kaisha Toshiba, Kawasaki, Japan

[21] Appl. No.: 195,870

[22] Filed: May 19, 1988

[30] Foreign Application Priority Data

May 21, 1987 [JP] Japan .................................. 62-124619

[51] Int. Cl.$^4$ ........................ G11C 19/28; H01L 29/78
[52] U.S. Cl. ......................................... 377/60; 357/24
[58] Field of Search ....................... 357/24; 377/57-63

[56] References Cited

U.S. PATENT DOCUMENTS

| 3,986,198 | 10/1976 | Kosonocky | 357/24 |
| 4,112,456 | 9/1978 | Lampe et al. | 357/24 |
| 4,606,060 | 8/1986 | Klar et al. | 357/24 |
| 4,771,445 | 9/1988 | Pelgrom et al. | 357/24 |
| 4,774,719 | 9/1988 | Pelgrom et al. | 357/24 |

OTHER PUBLICATIONS

Japanese Patent Disclosure (Kokai) No. 55-8007; Y. Hatano; disclosed Jan. 21, 1980.

Primary Examiner—Gene M. Munson
Attorney, Agent, or Firm—Finnegan, Henderson, Farabow, Garrett and Dunner

[57] ABSTRACT

A charge transfer device includes a source barrier electrode arranged on portion of an insulation film which lies between a source region and a signal input electrode over a semiconductor substrate and formed to isolate the source region from the signal input electrode, and a source storing electrode for storing substantial source charge. A pulse signal is supplied to the source barrier electrode and source storing electrode, and a D.C. source voltage is applied to the source region.

11 Claims, 7 Drawing Sheets

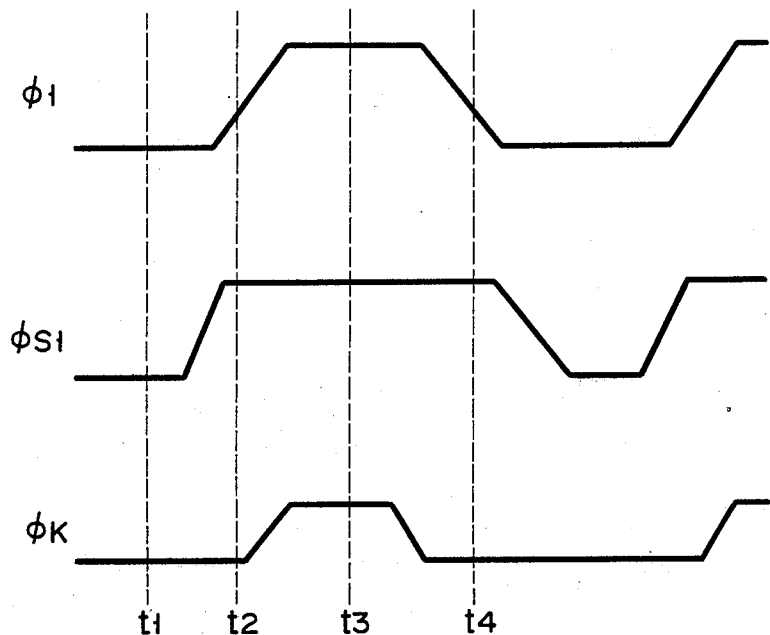
F I G. 3

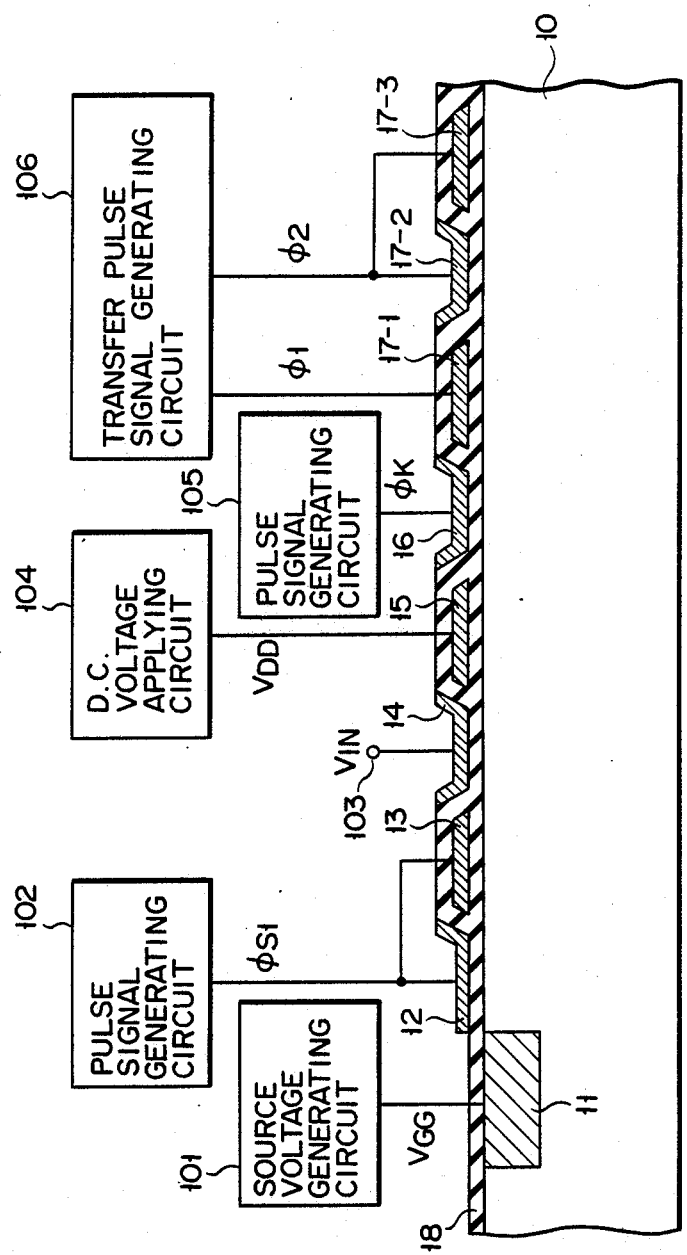
F I G. 4

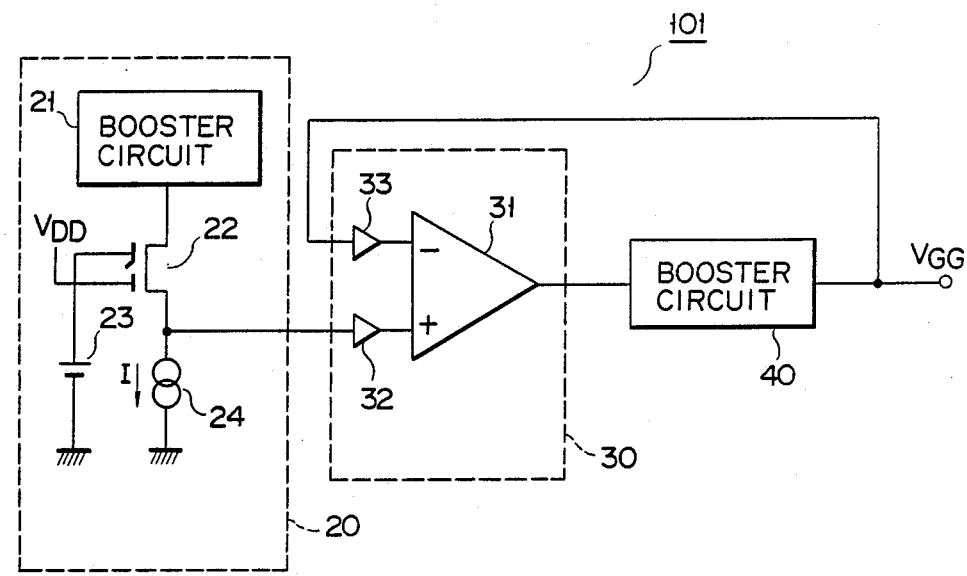
F I G. 8
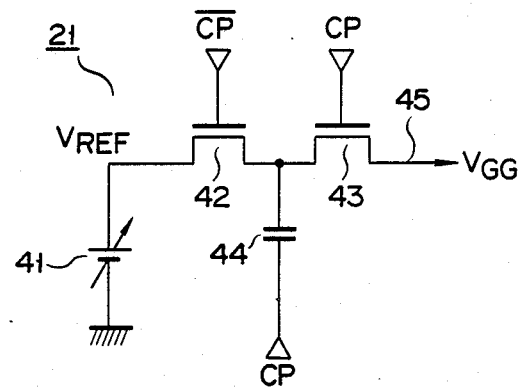
F I G. 9

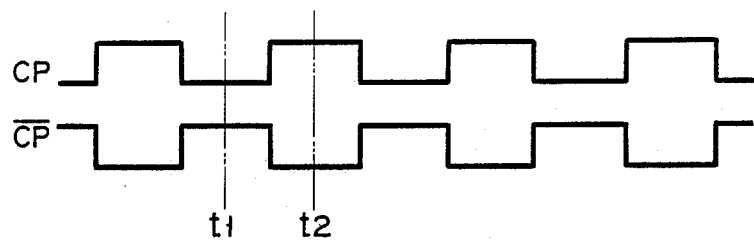
F I G. 10
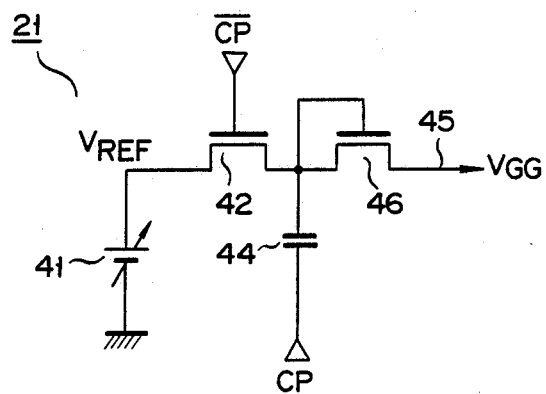
F I G. 11

INPUT CIRCUIT OF CHARGE TRANSFER DEVICE

BACKGROUND OF THE INVENTION

1. Field of the Invention

This invention relates to a charge transfer device used in, for example, a transversal filter, comb filter, charge transfer type delay line, solid state imaging device and the like, and more particularly to a charge transfer device whose input section for supplying input charges is improved.

2. Description of the Related Art

In the prior art, a fill-and-spill method is known as one of signal input methods for use in the input circuit of an integrated charge transfer device (which is hereinafter referred to as CTD). The fill-and-spill method is widely used as the input method for the CTD because charges can be linearly input. The fill-and-spill method is disclosed in, for example, U.S. Pat. No. 3,986,198 and Japanese Patent publication (KOUKOKU) No. 56-49460 (corresponding to U.S. Patent Application No. 758,184).

FIG. 1 is a cross-sectional view of an input section of the prior art buried channel CTD in which the fill-and-spill method is used. FIG. 2 shows the arrangement of electrodes in FIG. 1 together with the potential states for explaining the operation of the electrodes. FIG. 3 is a waveform diagram of pulse signals used in the input section of the CTD of FIG. 1. Source region 51 is formed in the main surface area of semiconductor substrate 50, and is supplied with pulse signal $\phi S1$. Signal input electrode 52 is formed on insulation film 60 and over that portion of substrate 50 which is adjacent to source region 51. Input signal $V_{IN}$ superposed on a D.C. bias is supplied to signal input electrode 52. Input charge storing electrode 53 for storing charges of an amount corresponding to input signal $V_{IN}$ is formed on insulation film 60 in position corresponding to that portion of substrate 50 which is adjacent to input electrode 52. Power source voltage $V_{DD}$ is applied to input charge storing electrode 53. Charge injection electrode 54 for transferring charges measured in the input section to charge transfer electrodes 55-1, 55-2, ... is formed on insulation film 60 in position corresponding to that portion of substrate 50 which is adjacent to input charge storing electrode 53. Pulse signal $\phi K$ is supplied to charge injection electrode 54. Charge transfer electrodes 55-1, 55-2, ... are formed on insulation film 60 in position corresponding to that portion of substrate 50 which is adjacent to charge injection electrode 54. A pulse train of $\phi 1$, $\phi 2$, $\phi 2$, $\phi 1$, $\phi 1$, $\phi 2$, $\phi 2$, ... are supplied to charge transfer electrodes 55-1, 55-2, 55-3, ... . A threshold voltage at which an inversion layer is formed in the surface area of substrate 50 when voltages are applied to respective electrodes 52, 53, 54, 55-1, 55-2, ... is negative. That is, the device is depletion type.

The CTD with the above construction operates as follows. At timing t1 in FIG. 3, since $\phi S1$ and $\phi K$ are both at a low level, charges are filled in an area under signal input electrode 52 and input charge storing electrode 53 as shown in FIG. 2. At this time, the potential of source region 51 is PSL: the potential of the surface area of substrate 50 under signal input electrode 52 is P1; the potential of the surface area of substrate 50 under input charge storing electrode 53 is PD; and the potential of the surface area of substrate 50 under charge injection electrode 54 is PKL. At timing t2, $\phi S1$ is set at a high level, and $\phi K$ is kept at the low level so that charges in portions set at a potential lower than P1 can be spilit into an area under source region 51 and an area under input charge storing electrode 53 can be filled with charges held at a potential higher than P1. At timing t3, $\phi K$ is set at a high level, and charges of an amount corresponding to $|P1-PK|$ are injected as signal charge QS into an area under charge transfer electrode 55-1. In this case, PK is a potential of an area under charge injection electrode 54 which is set when $\phi K$ is kept at a high level. At timing t4, $\phi K$ is set to the low level, areas under input charge storing electrode 53 and transfer electrode 55-1 are isolated from each other by the potential of an area under charge injection electrode 54. After this, if the same operation as the cycle of t1 to t4 are repeatedly effected, signal charges corresponding to the voltage level of input signal $V_{IN}$ are sequentially transferred to an area under charge transfer electrode 55-1. The charge transferred to under charge transfer electrode 55-1 is sequentially transferred to the right in FIG. 1 under charge transfer electrodes 55-2, 55-3, ... in response to pulse signals $\phi 1$ and $\phi 2$.

In a case where a CTD is designed to operate on a low power source voltage, there is a lower limit to which potential $|V_{THD}|$ obtained when 0 V is applied to the respective gates of the CTD can be lowered. This is because charges transferred along the surface area of substrate 50 may be trapped by the effect of the surface level when $|V_{THD}|$ is set lower than a certain level, thus lowering the charge transfer efficiency. Further, when $|V_{THD}|$ is fixedly set at the lower limit and if it is required to lower the power source voltage, it will be necessary to frequently use booster circuits. That is, in a case where potential PSL becomes higher than power source voltage $V_{DD}$ under a condition that potential "P1-PSL" necessary for attaining a satisfactory input operation is set, it becomes necessary to raise not only the high voltage level but also the low voltage level of pulse signal $\phi S1$ supplied to source region 51. For this reason, it becomes difficult to raise pulse $\phi S1$. Further, if attempts are made to modify the circuit in order to reduce influence on the device characteristics due to process variation, the circuit will become complex in construction. Thus, it is extremely difficult to operate the prior art CTD on a low voltage.

As described above, in the prior art charge transfer device, a linear charge input operation cannot be attained at a low operation voltage without making the circuit construction complex.

SUMMARY OF THE INVENTION

Accordingly, an object of this invention is to provide a charge transfer device which can effect the linear charge input operation with the circuit construction kept relatively simple.

Another object of this invention is to provide a charge transfer device which a sufficiently large margin irrespective of process variation.

According to one aspect of this invention, there is provided a charge transfer device which comprises a source region to which a D.C. source voltage is applied; a source barrier electrode, a source charge storing electrode, a signal input electrode, an input charge storing electrode and a charge injection electrode which are successively formed on an insulation layer in position corresponding to portion of a semiconductor substrate adjacent to the source region; a plurality of charge transfer electrodes arranged adjacent to the charge injection electrode; a source voltage generation circuit for generating the D.C. source voltage applied to the source region; a first pulse signal generating circuit for supplying a common pulse signal to the source barrier electrode and source storing electrode; an input terminal for supplying an input signal to the signal input electrode; a D.C. voltage generating circuit for applying a preset D.C. voltage to the input charge storing electrode; a second pulse signal generating circuit for supplying a pulse signal to the charge injection electrode; and a transfer pulse signal generating circuit for supplying a transfer pulse to the plurality of transfer electrodes.

As described above, the source barrier electrode for isolation between the source region and the charge storing electrode and the storing electrode for storing substantial source charge are provided on the insulation film and over portion of the semiconductor substrate between the signal input electrode and source region of the charge transfer device. A pulse signal which is in phase with a pulse signal applied to the source region of the prior art CTD is applied to the source barrier electrode and source storing electrode. Further, a D.C. source voltage is applied to the source region. With this construction, it becomes unnecessary to raise the pulse signal which is difficult to raise. Since the source voltage is a D.C. voltage, it can be easily raised without using a complex booster circuit. Therefore, even in a case where a linear charge input operation is effected with a low operation voltage, a charge transfer device which is simple in construction can be used.

BRIEF DESCRIPTION OF THE DRAWINGS

FIG. 3 is a waveform diagram of pulses used in the input sections of the prior art CTD and the CTD of this invention;

FIG. 4 is a cross-sectional view of the input section of a CTD according to one embodiment of this invention;

FIG. 8 is a circuit diagram showing another construction of the source voltage generating circuit used in the CTD shown in FIG. 5;

FIG. 9 is a circuit diagram of a booster circuit used in the source voltage generating circuit of FIG. 8;

FIG. 10 is a timing chart of control pulses used in the circuit of FIG. 9; and

FIG. 11 is a circuit diagram showing another construction of the booster circuit used in the source voltage generating circuit of FIG. 8.

DETAILED DESCRIPTION OF THE PREFERRED EMBODIMENTS

Figure 5:
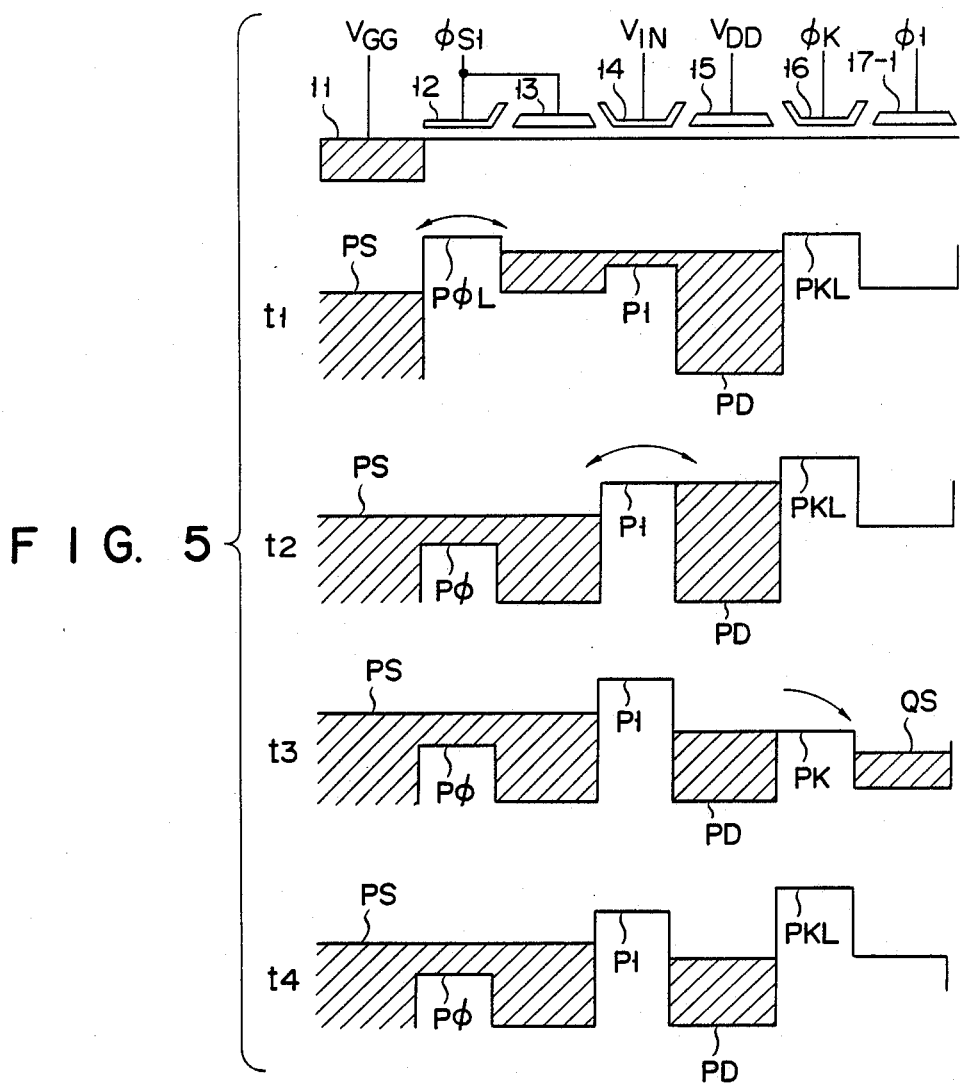
FIG. 5 is a diagram for illustrating the operation of the CTD shown in FIG. 4, and showing the arrangement of electrodes and potential states of the semiconductor surface under the electrodes at different timings.

FIG. 4 is a cross-sectional view showing the input section of a buried channel CTD according to one embodiment of this invention. FIG. 5 is a diagram for illustrating the operation of the CTD shown in FIG. 4, and showing the arrangement of electrodes and potential states of the semiconductor surface under the electrodes at different timings.

Source region 11 is formed in the main surface area of semiconductor substrate 10. Insulation film 18 is formed between substrate 10 and electrodes 12 to 16 and 17-1, 17-2, ... to isolate substrate 10 from electrodes 12 to 16 and 17-1, 17-2, .... Source region 11 from signal input electrode 14 is formed on insulation film 18 in position corresponding to that portion of substrate 10 which is adjacent to source region 11. Source storing electrode 13 for storing substantial source charge is formed on insulation film 18 and over that portion of substrate 10 which is adjacent to source barrier electrode 12. Signal input electrode 14 is formed on insulation film 18 and over that portion of substrate 10 which is adjacent to source storing electrode 13. Input charge storing electrode 15 is formed on insulation film 18 and over that portion of substrate 10 which is adjacent to signal input electrode 14. Charge injection electrode 16 is formed on insulation film 18 and over that portion of substrate 10 which is adjacent to input charge storing electrode 15. Charge transfer electrodes 17-1, 17-2, ... are formed on insulation film 18 and over that portion of substrate 10 which is adjacent to charge injection electrode 16. Electrodes 12 to 16 and 17-1, 17-2, ... formed of a two-layered polysilicon layer formed on insulation film 18 over semiconductor substrate 10. In other words, electrodes 13, 15, 17-1 and 17-3 are formed of a first polysilicon layer and electrodes 14, 16 and 17-2 are formed of a second polysilicon layer.

Predetermined D.C. voltage $V_{GG}$ generated from source voltage generating circuit 101 is applied to source region 11. Source barrier electrode 12 is electrically connected to source storing electrode 13, and pulse signal $\phi S1$ generated from pulse signal generating circuit 102 is applied to electrodes 12 and 13. Input signal $V_{IN}$ superposed on a D.C. bias voltage is supplied to signal input electrode 14 via input terminal 103. Input charge storing electrode 15 is supplied with a predetermined D.C. voltage such as power source voltage $V_{DD}$ (or derived by dividing the voltage between the power source and ground) generated from D.C. voltage application circuit 104. Further, charge injection electrode 16 is supplied with pulse signal $\phi K$ generated from pulse signal generating circuit 105. In the case of a 2-phase driving type CTD, 2-phase pulse signals $\phi 1$ and $\phi 2$ which are generated from transfer pulse signal generating circuit 106 are alternately supplied to charge transfer electrodes 17-1, 17-2, 17-3, ..., such that first, pulse signal $\phi 1$ is supplied to electrode 17-1, second, pulse signal $\phi 2$ is supplied to electrodes 17-2 and 17-3, third, pulse signal $\phi 1$ is supplied to next two electrodes (i.e. 17-4 and 17-5), and so on.

Figure 1:
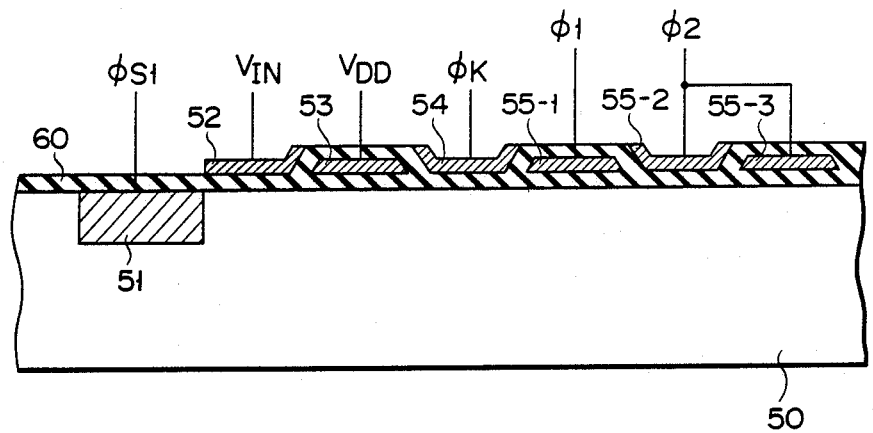
FIG. 1 is a cross-sectional view of an input section of the prior art CTD.
Figure 2:
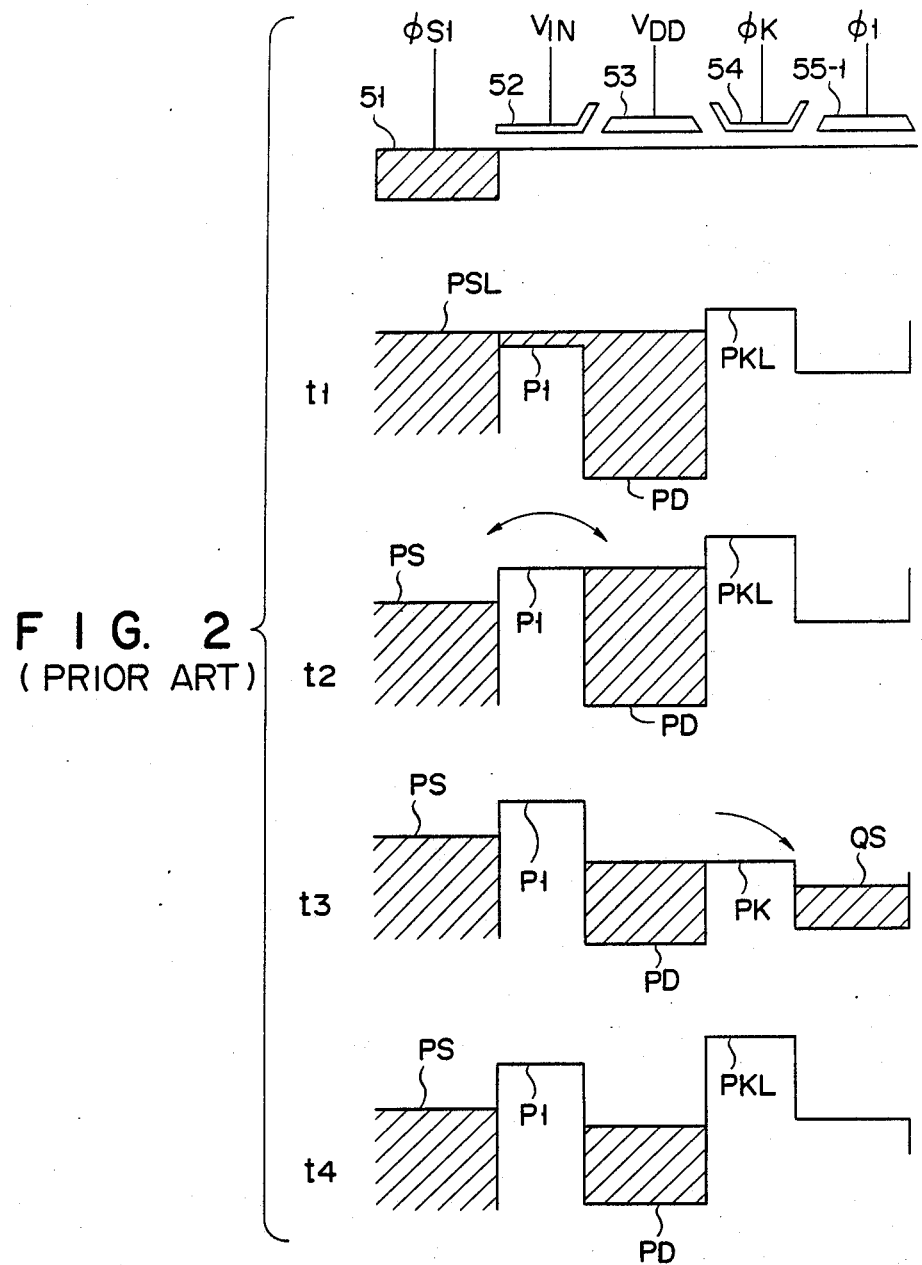
FIG. 2 is a diagram for illustrating the operation of the CTD shown in FIG. 1, and showing the arrangement of electrodes and potential states of the semiconductor surface under the electrodes at different timings.

The waveforms of the pulse signals used in the CTD shown in FIGS. 4 and 5 are shown in FIG. 3 in the same manner as in the circuit of FIG. 1. There will now be described the operation of the CTD with the above construction with reference to FIG. 3.

At timing t1, $\phi S1$ and $\phi K$ are set at a low level, and a maximum permissible amount of charges are stored in a potential well formed under source barrier electrode 12 and source storing electrode 13. The charge stored under source storing electrode 13 acts as the substantial source charge. At this time, potentials at source region 11, source barrier electrode 12, signal input electrode 14, input charge storing electrode 15 and charge injection electrode 16 are set at PS, PφL, P1, PD and PKL, respectively.

At timing t2, φS1 is changed to a high level with φK kept at the low level, and therefore potential Pφ at the area under source barrier electrode 12 is set higher than potential PS of source region 11. In this way, charges under source storing electrode 13 are preset by the source charge. Further, an area under input charge storing electrode 15 is filled with charges set at a potential higher than potential P1 of the area under signal input electrode 14.

At timing t3, φK is set at the high level, raising the potential at the area under charge injection electrode 16 from PKL to PK. Thus, charge of an amount |P1-PK| is injected as signal charge QS into an area under charge transfer electrode 17-1.

At timing t4, φK is again set to the low level so that areas under input charge storing electrode 15 and transfer electrode 17 are isolated from each other by low potential PKL of an area under charge injection electrode 16. After this, the same operation as the cycle of t1 to t4 is repeatedly effected to sequentially inject the signal charge into an area under charge transfer electrode 17-1. The charge injected into the area under charge transfer electrode 17-1 is sequentially transferred to the right under electrodes 17-2, 17-3, ... in response to pulse signals φ1 and φ2 generated from transfer pulse generating circuit 106.

The CTD of this embodiment can be normally operated under a condition that potential PS which is substantially equal to voltage $V_{GG}$ and which is set when D.C. source voltage $V_{GG}$ is applied to source region 11 is set lower than potential Pφ set at the area under source barrier electrode 12 when pulse signal φS1 is at the high level, and is set always higher than potential P1 of the area under signal input electrode 14. That is, it is necessary to always satisfy the following expression:

$$P1 < PS < P\phi \qquad (1)$$

In the case where the high and low levels of pulse signal φS1 are properly set in order to satisfy the condition, they can be respectively set by using the high and low power source voltages. Source voltage $V_{GG}$ is a D.C. voltage, and it is only necessary to raise the voltage by a preset amount in order to satisfy the condition of expression (1). The D.C. voltage raising operation can be easily effected in comparison with the A.C. voltage raising operation. As a result, even in a case where a linear charge input operation is effected using a low power source voltage, a peripheral circuit such as a booster circuit is not made complex in construction and can be formed with a simple construction.

When a sufficiently large process margin is provided, source voltage $V_{GG}$ may be set to a properly selected value in order to satisfy expression (1). However, if there is a possibility that a sufficiently large process margin cannot be provided, it becomes necessary to adjust source voltage $V_{GG}$ according to the process variation.

Figure 6:
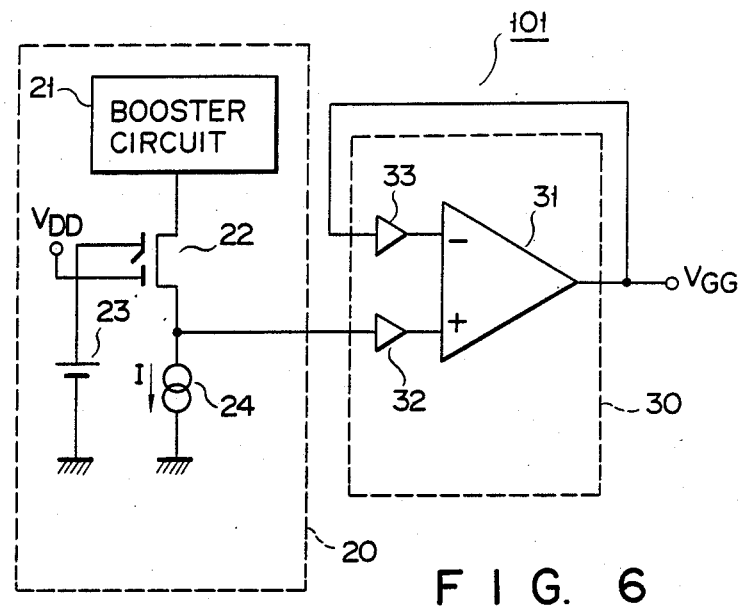
FIG. 6 is a circuit diagram of a source voltage generating circuit for generating a source voltage used in the CTD shown in FIG. 5.

FIG. 6 is a circuit diagram showing the construction of source voltage generating circuit 101 in the CTD of this invention which is suitable in a case where the process margin may be set smaller than a desired value.

Source voltage generating circuit 101 is constituted by voltage generating circuit 20 and comparison-control circuit 30. Voltage generating circuit 20 substantially detects the potential of the area under source barrier electrode 12, and generates a voltage corresponding to a potential which is lower than the detected potential by predetermined amount α. Comparison-control circuit 30 generates the source voltage based on the voltage generated from voltage generating circuit 20.

Voltage generating circuit 20 includes booster circuit 21 for raising the power source voltage and generate a constant voltage, depletion type (D-type) MOS transistor 22 having gate electrodes of the same construction as source barrier electrode 12 and source storing electrode 13, constant voltage source 23 and constant current source 24. Booster circuit 21 generates a constant voltage which is slightly higher than the potential of an area under the channel region of MOS transistor 22 and which is supplied to the drain of MOS transistor 22. Constant voltage source 23 for supplying a constant voltage having substantially the same level as the high level of pulse signal φS1 is connected to that gate electrode of MOS transistor 22 which corresponds to source barrier electrode 12. Further, the other gate electrode of MOS transistor 22 which corresponds to source storing electrode 13 is connected to receive a sufficiently high D.C. voltage such as power source voltage $V_{DD}$. The source of MOS transistor 22 is connected to constant current source 24, and a voltage at a connection node between the source of MOS transistor 22 and constant current source 24 is supplied to comparison-control circuit 30.

Comparison-control circuit 30 includes comparator 31 for comparing two voltages, level shifter circuit 32 for shifting an output voltage generated from voltage generating circuit 30 of a level within the operation voltage range of comparator 31 and supplying the shifted voltage as an input voltage to comparator 31, and level shifter circuit 33 for shifting an output voltage of comparator 31 and feeding the shifted voltage as the other input voltage back to comparator 31. Comparison-control circuit 30 constitutes a buffer circuit which generates a voltage equivalent to a voltage generated from voltage generating circuit 20. Two level shifter circuits 32 and 33 are used to shift respective output voltages from voltage generating circuit 20 and comparator 31 to voltage levels to which comparator 31 may respond with a relatively high sensitivity. If a voltage generated from voltage generating circuit 30 is within the operation voltage range of comparator 31 or if a high sensitivity is not required, level shifter circuits 32 and 33 can be omitted.

Figure 7:
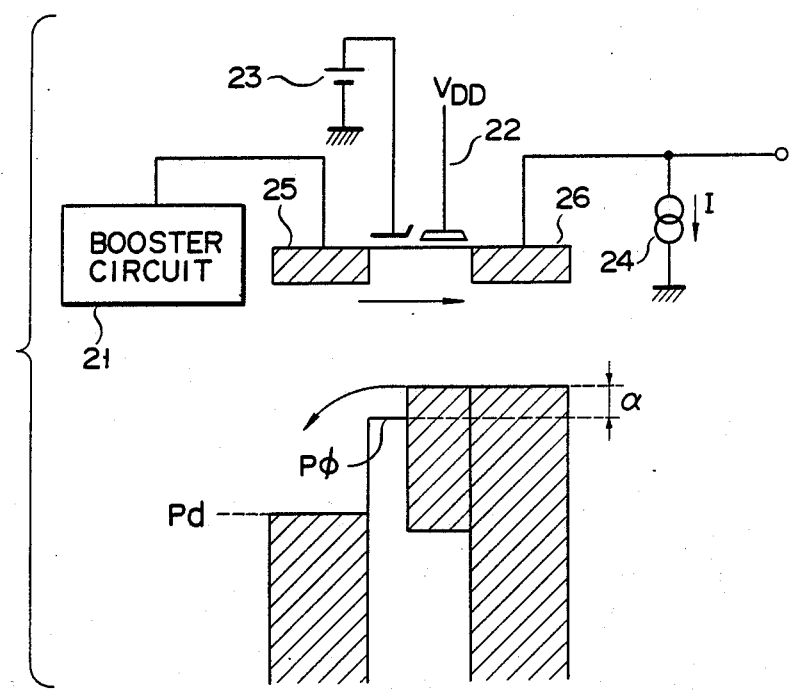
FIG. 7 is a diagram showing the potential states for illustrating the operation of the source voltage generating circuit.

Now, the operation of the source voltage generating circuit with the construction described above is explained with reference to FIG. 7 showing the potential states. A constant voltage from booster circuit 21 is applied to drain region of MOS transistor 22 in voltage generating circuit 20, and drain region 25 is set at constant potential Pd. Since a voltage which is equal to the high level voltage of pulse signal φS1 and is generated from constant voltage source 23 is applied to the gate electrode of MOS transistor 22 corresponding to source barrier electrode 12, the area under the gate electrode is set at potential Pφ which is the same as the potential set at the area under source barrier electrode 12. Further, since constant current source 24 is connected to source region 26 of MOS transistor 22 so as to cause current I to flow via the drain and source by means of constant current source 24, potential of source region 26 of MOS transistor 22 is set to "Pφ-α" which is obtained by subtracting potential drop α due to current I from potential P$\phi$ of the area under the channel region, and a voltage corresponding to the potential is transmitted to source region 26. In this case, current I is so adjusted that a value corresponding to $\alpha$ can be set equal to the preset margin which is determined by a difference between potential PS of source region 11 and high potential P$\phi$ set at the area under source barrier electrode 12 at the preset time.

An output voltage equal to the output voltage generated from voltage generating circuit 20 is generated from comparison-control circuit 30, and is supplied as source voltage $V_{GG}$ to source region 11 shown in FIGS. 4 and 5.

Therefore, even if the threshold voltage of a D-type MOS transistor including, for example, the area under source barrier electrode 12 varies, the potential of source region 11 will also vary accordingly. Therefore, only if source voltage generating circuit 101 of the construction shown in FIG. 6 is used, expression (1) can be satisfied even when a sufficiently large process margin cannot be obtained. Thus, a linear charge input operation can be effected with a low operation voltage.

FIG. 8 is a circuit diagram showing another construction of source voltage generating circuit 101 used in the CTD of the above embodiment. Source voltage generating circuit 101 is used when it is required to set source voltage $V_{GG}$ applied to source region 11 higher than the maximum level of power source voltage $V_{DD}$. In this case, booster circuit 40 for raising a preset voltage is provided in addition to voltage generating circuit 20 and comparison-control circuit 30. A stepped-up output voltage from booster circuit 40 is supplied to level shifter circuit 33 of comparison-control circuit 30. Booster circuit 40 raises a preset reference voltage and generates source voltage $V_{GG}$. An output voltage from comparison-control circuit 30 is supplied as a control input voltage to booster circuit 40, and the level of the reference voltage is changed according to the control input voltage for various voltage raising operations.

FIG. 9 is a circuit diagram showing the detail construction of booster circuit 40 used in source voltage generating circuit 101 of FIG. 8. Control pulses CP and $\overline{CP}$ used in the circuit are shown by the timing chart of FIG. 10. In FIG. 9, reference voltage source 41 generates reference voltage $V_{REF}$. One end of enhancement type (E-type) MOS transistor 42 is connected to reference voltage source 41. One end of E-type MOS transistor 43 is connected to the other end of MOS transistor 42. Capacitor 44 is connected at one electrode to a connection node between MOS transistors 42 and 43. The other end of MOS transistor 43 is used as output terminal 45 for outputting a raised voltage. Control pulse CP is applied to the other electrode of capacitor 44 and the gate of MOS transistor 43, and control pulse $\overline{CP}$ is applied to the gate of MOS transistor 42.

At timing t1 at which control pulse CP is at a low level, MOS transistor 42 is set in the conductive state, MOS transistor 43 is set in the nonconductive state, and capacitor 44 is charged by reference voltage $V_{REF}$ from reference voltage source 41 via MOS transistor 42. At timing t2 at which control pulse CP is set high, MOS transistor 42 is turned off, MOS transistor 43 is turned on, and a voltage at output terminal 45 is raised by the peak value of control pulse CP with respect to reference voltage $V_{REF}$. At this time, reference voltage source 41 is so constructed that reference voltage $V_{REF}$ from reference voltage source 41 can be changed according to an output voltage of comparison-control circuit 30.

FIG. 11 is circuit diagram showing another detail construction of booster circuit 40 used in source voltage generating circuit 101 of FIG. 8. In this booster circuit, diode-connected E-type MOS transistor 46 is used instead of MOS transistor 43 whose gate is connected to receive control pulse CP as shown in FIG. 9. The booster circuit performs substantially the same voltage raising operation as that of booster circuit 40 shown in FIG. 8. However, in this case, the raised output voltage is lowered by the threshold voltage of diode-connected MOS transistor 46.

This invention is not limited to the above embodiments, and various modifications can be made. For example, in a case where a voltage corresponding to potential "P$\phi$-$\alpha$" which is lower than potential P$\phi$ of the area under source barrier electrode 12 by $\alpha$ is generated from voltage generating circuit 20 shown in FIG. 6 or 8, constant current source 24 is used in the above embodiment. However, such a voltage can be obtained by setting the output voltage of constant voltage source 23 lower than the high voltage level of pulse signal $\phi$S1 actually applied to source barrier electrode 12, or by adjusting channel width W of MOS transistor 22.

Further, booster circuit 40 in source voltage generating circuit 10 shown in FIG. 8 can be so modified that the voltage raising operation can be controlled by the control voltage from comparison-control circuit 30. For example, it is possible to keep the reference voltage from reference voltage source 41 at a constant voltage level, and change a raised voltage by changing the amplitude of control pulse CP according to the control voltage from comparison-control circuit 30.

Still further, in the arrangement of FIG. 5, electrode 15 may be applied with a specific voltage providing the potential relation "PD<PK", in order that charge QS representing the potential difference of |P1−PD| is injected into an area just under charge transfer electrode 17-1.

As described above, according to this invention, a charge transfer device can be provided which has a sufficiently large process margin to minimize influence due to process variation and which can perform the linear charge input operation at a low power source voltage without making the construction complex.

What is claimed is:

1. A charge transfer device comprising:
   a semiconductor substrate of a first conductivity type;
   a source region formed in the main surface area of said semiconductor substrate;
   an insulation film formed on said semiconductor substrate;
   a signal input electrode formed on said insulating film;
   a source barrier electrode arranged between said source region and said signal input electrode on said insulation film and formed to isolate said source region from said signal input electrode;
   a source charge storing electrode arranged adjacent to said source barrier electrode, between said source region and said signal input electrode on said insulation film;
   an input charge storing electrode formed adjacent to said signal input electrode on said insulation film;
   a charge injection electrode formed adjacent to said input charge storing electrode on said insulation film;

a plurality of charge transfer electrodes formed adjacent to said charge injection electrode on said insulation film;

source voltage generating means for generating a D.C. source voltage applied to said source region;

first pulse signal generating means for supplying a first pulse signal to said source barrier electrode and said source charge storing electrode;

input signal supplying means for supplying an input signal to said signal input electrode;

D.C. voltage applying means for applying a preset D.C. voltage to said input charge storing electrode;

second pulse signal generating means for supplying a second pulse signal to said charge injection electrode; and transfer pulse signal generating means for supplying transfer pulse signals to said charge transfer electrodes.

2. A charge transfer device according to claim 1, wherein said source voltage generating means includes voltage setting means for setting a voltage equal to a potential which is lower than a potential of an area under said source barrier electrode by $\alpha$; and comparison-control means having first and second input terminals, the first input terminal being connected to receive a voltage set by said voltage setting means as a reference voltage input and the second input terminal being connected to receive the source voltage.

3. A charge transfer device according to claim 2, wherein said voltage setting means includes a booster circuit for raising a power source voltage to generate a constant voltage; a depletion type MOS transistor having the same gate electrode structure as said source barrier electrode and source charge storing electrode and being connected at one end to the output terminal of said booster circuit; a constant voltage source connected to the gate electrode of said MOS transistor which corresponds to said source barrier electrode for supplying an output voltage having the same voltage level as a high voltage level of the first pulse signal generated from said first pulse generating means; a terminal connected to the gate electrode of said MOS transistor which corresponds to said source charge storing electrode for receiving a D.C. voltage; and a constant voltage source connected between the other end of said MOS transistor and ground.

4. A charge transfer device according to claim 2, wherein said comparison-control means includes a comparator having a first input terminal connected to receive an output voltage from said voltage setting means and a second input terminal to which an output of said comparator is fed back.

5. A charge transfer device according to claim 2, wherein said comparison-control means includes a first level shifter circuit having an input terminal connected to the output terminal of said voltage setting means; a comparator having a first input terminal connected to an output terminal of said first level shifter circuit; and a second level shifter circuit having an input terminal connected to an output terminal of said comparator and an output terminal connected to a second input terminal of said comparator.

6. A charge transfer device according to claim 2, wherein said source voltage generating means further includes booster means for raising a reference voltage under control of the output of said comparison-control means.

7. A charge transfer device according to claim 6, wherein said booster means includes a reference voltage source for generating a reference voltage; a first MOS transistor of enhancement type having one end connected to receive an output voltage of said reference voltage source and a gate connected to receive a control pulse; a second MOS transistor of enhancement type connected at one end to the other end of said first MOS transistor and having a gate connected to receive an inverted signal of the control pulse; and a capacitor having a first electrode connected to a connection node between said first and second MOS transistors and a second electrode connected to receive an inverted control pulse.

8. A charge transfer device according to claim 6, wherein said booster means includes a reference voltage source for generating a reference voltage; a first MOS transistor of enhancement type having one end connected to receive an output voltage of said reference voltage source and a gate connected to receive a control pulse; a second MOS transistor of enhancement type having one end and a gate connected to the other end of said first MOS transistor; and a capacitor having a first electrode connected to a connection node between said first and second MOS transistors and a second electrode connected to receive an inverted control pulse.

9. A charge transfer device according to claim 1, wherein said input signal supplying means includes an input terminal.

10. A charge transfer device according to claim 1, wherein a D.C. voltage applied from said D.C. voltage applying means to said input charge storing electrode is a power source voltage.

11. A charge transfer device according to claim 1, wherein a D.C. voltage applied from said D.C. voltage applying means to said input charge storing electrode is derived by dividing the voltage between a power source and a ground.

* * * * *